(12) United States Patent
Barror (10) Patent No.: US 6,765,396 B2
(45) Date of Patent: Jul. 20, 2004

(54) METHOD, APPARATUS AND SOFTWARE FOR TESTING A DEVICE INCLUDING BOTH ELECTRICAL AND OPTICAL PORTIONS

(75) Inventor: Michael W. Barror, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 108 days.

(21) Appl. No.: 10/116,179

(22) Filed: Apr. 4, 2002

(65) Prior Publication Data

US 2003/0189440 A1 Oct. 9, 2003

(51) Int. Cl.$^7$ .............................................. G01R 31/308
(52) U.S. Cl. ................. 324/753; 324/158.1; 250/341.4; 385/14; 385/15; 385/18
(58) Field of Search ............................. 324/753, 158.1, 324/751, 752, 765, 763, 155; 250/227.17, 227.11, 559.45, 559.46; 714/733, 734, 724; 385/14, 15, 18, 3; 29/25.01, 742

(56) References Cited

U.S. PATENT DOCUMENTS

| | | | | | |
|---|---|---|---|---|---|
| 5,821,529 | A | * | 10/1998 | Chihara et al. | 250/214.1 |
| 6,018,248 | A | * | 1/2000 | Kelley et al. | 324/755 |
| 6,156,078 | A | * | 12/2000 | Huat | 29/25.01 |
| 6,586,953 | B1 | * | 7/2003 | Okayasu | 324/753 |

* cited by examiner

*Primary Examiner*—Kamand Cuneo
*Assistant Examiner*—Jimmy Nguyen
(74) *Attorney, Agent, or Firm*—Toler, Larson & Abel, LLP (57) ABSTRACT

A method, device and software are disclosed which permit testing of both the optical portion and the electrical portion of an imaging device in a live bug configuration. Once an automated handler has positioned the device to be tested, the optical sensor on the image device is illuminated with electromagnetic radiation and electrical test signals are provided through the electrical pins on the integrated circuit package. These electrical and optical tests can be performed in sequence or simultaneously. The automated handler does not need to reposition or disengage from the device under test until both the electrical and optical tests are completed.

27 Claims, 7 Drawing Sheets

METHOD, APPARATUS AND SOFTWARE FOR TESTING A DEVICE INCLUDING BOTH ELECTRICAL AND OPTICAL PORTIONS

FIELD OF THE DISCLOSURE

The present invention relates generally to testing a device using an automated tester, and more particularly to testing both the electrical and optical portions of the device.

BACKGROUND

Imaging devices are used in many of today's consumer electronic products, as well as in various commercial and government applications. These imaging devices must be made as small as possible to facilitate use in portable products such as hand-held video recorders and the like. In order to make these imaging devices as small as possible, it is often desirable to include an optical sensor in the same package with associated electronic circuitry. Such an imaging device is shown in prior art FIG. 1.

Figure 1:
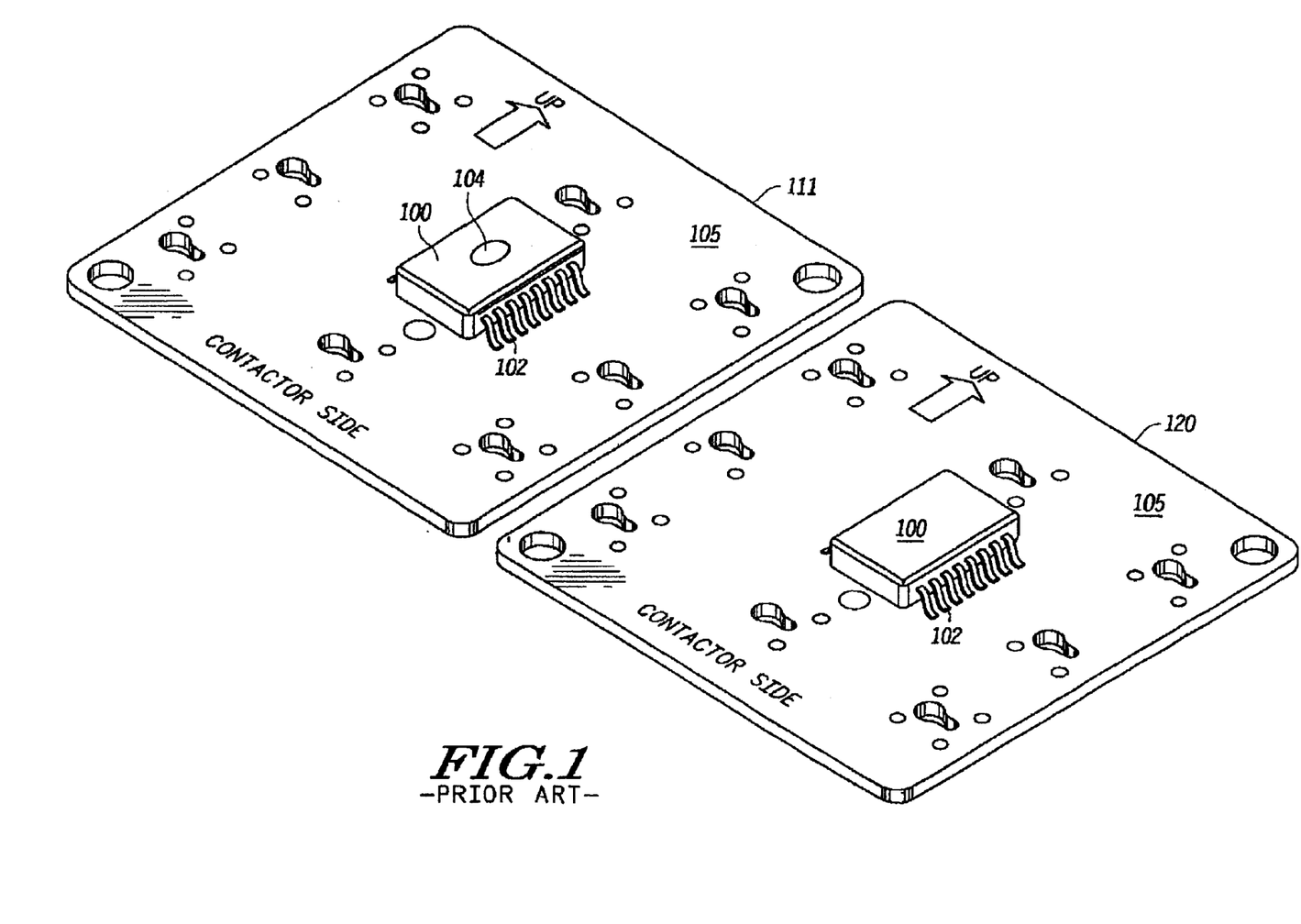
FIG. 1 is a prior art diagram illustrating "dead bug" and "live bug" orientation of devices under test.

In order to test an imaging device using an automated handler, for example an integrated circuit handler, the imaging device, for example imaging device 100, is normally positioned with electrical leads 102 pointing toward the test hardware such as is illustrated in orientation 111 of FIG. 1. Note that manufacturers often place the optical sensor 104, which may be an individual sensor or an array of sensors, on the top of imaging device 100 so that the optical sensor 104 is positioned away from the test hardware when electrical leads 102 are positioned for testing using automated handling equipment. An imaging device 100 oriented for electrical testing is shown in orientation 111, which is sometimes referred to as a "live bug" orientation because the integrated circuit package of imaging device 100 resembles a crawling bug.

Since the imaging device 100 includes an optical sensor 104, full parametric and functional testing of imaging device 100 requires the use of a controlled light source in addition to electrical test signals. These light sources are relatively large and are therefore usually placed inside of a test head (not shown) located beneath load-board/plate 105, where sufficient space is available. As a result, the light source cannot illuminate optical sensor 104 when imaging device 100 is positioned in a live bug orientation.

Consequently, in order to test the optical sensor portion of imaging device 100, imaging device 100 must be flipped over so that optical sensor 104 faces the test head and electrical leads 102 face away from the testing equipment as illustrated in orientation 120. The orientation of imaging device 100 shown in orientation 120 is sometimes referred to as a "dead bug" orientation because imaging device 100 resembles a bug lying on its back with its legs sticking up in the air.

One disadvantage of having to position the imaging device 100 in both live bug and dead bug orientations is that some package configurations cannot be properly positioned in both orientations using currently available integrated circuit handlers. Even where currently available integrated circuit handlers can properly position an image device in a dead bug orientation, extra positioning steps are required to completely and fully test devices having both optical and electrical portions. The requirement of extra positioning steps can add extra time and expense to the testing of devices such as imaging device 100.

Another factor to consider when testing devices in a dead bug orientation, is the need for more electrical connections to the handler. Extra connections are needed because in a dead bug orientation, the electrical pins face away from the tester, and signals must somehow be routed back to the tester. Normally these extra connections are provided by pogo pins, which sometimes fail and need to be replaced. For each electrical pin on the device being tested in dead bug orientation, two pogo pins are needed. Therefore, if a device to be tested includes eight electrical pins, sixteen pogo pins are required. Each of these sixteen pogo pins has a failure rate, and if any one of them fails the handler may be unusable until the pogo pin is replaced.

As should be apparent from the above discussion, currently available testing methodologies for devices including both optical and electrical portions are less than ideal, because fully automated testing can not be performed in some cases, and in other cases extra positioning steps are required to fully test imaging devices. What is needed is some way to permit testing of devices including both optical and electrical portions using a single device orientation.

BRIEF DESCRIPTION OF THE DRAWINGS

Various display objects, advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 2–10 illustrate how a device including both optical and electrical inputs can be tested from a single orientation. By providing an optical source carried by an automated handler, electrical contact can be made between the electrical pins of a device under test so that the electrical portion of the device can be tested, and the optical source carried by the automated handler can illuminate the optical sensor without requiring that the electrical connectors of the device be removed from contact with the tester. Testing an imaging device in this way provides the advantage or requiring only a single handling/positioning step to position a device for both optical and electrical testing.

Figure 2:
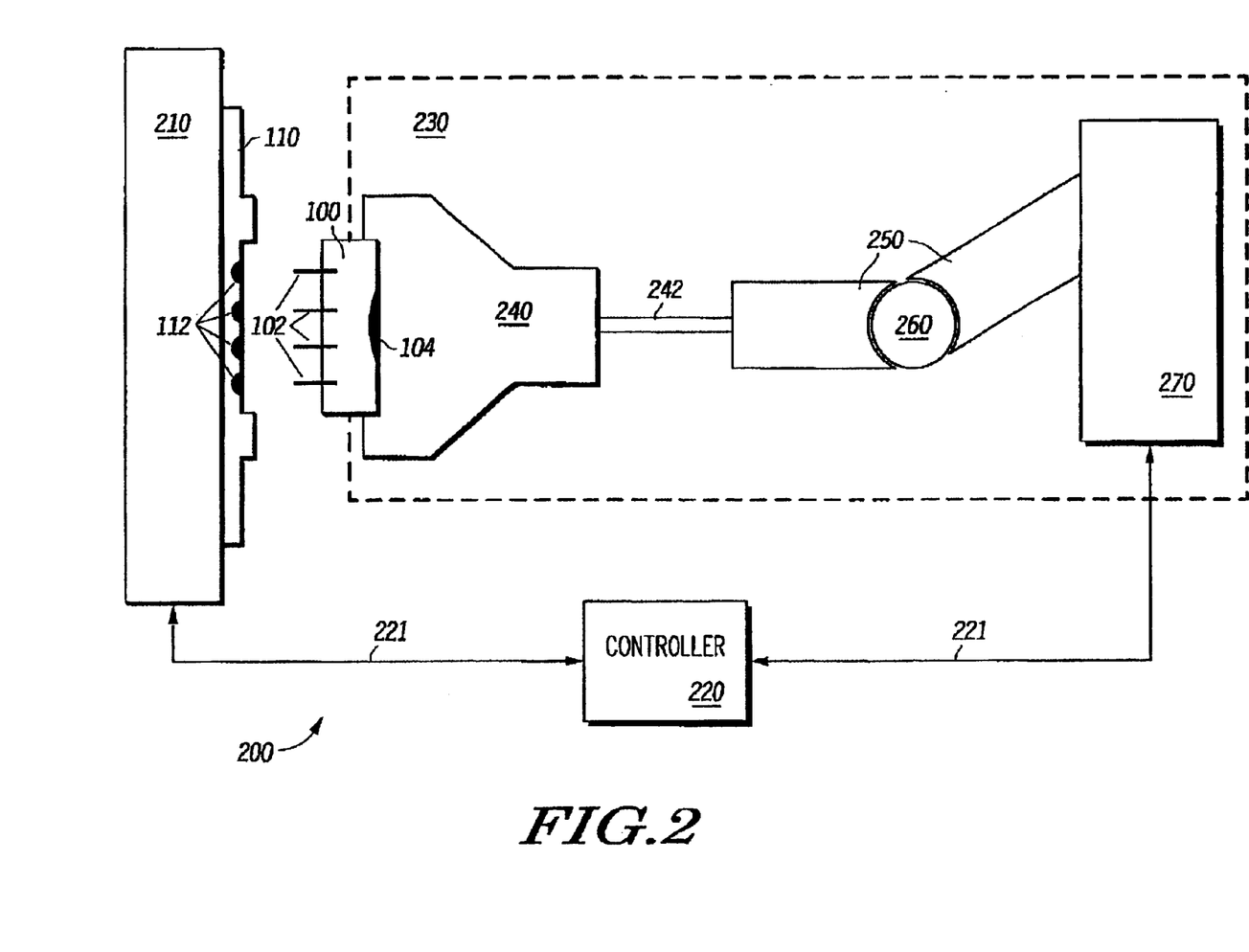
FIG. 2 is a diagram illustrating an automated handling system positioning a package including both an optical portion and an electrical portion for testing according to an embodiment of the present invention.

Referring now to FIG. 2, a testing system will be discussed according to an embodiment of the present invention. Testing system 200 includes automated handler 230, tester 210, and controller 220. It will be appreciated that although controller 220, tester 210 and automatic handler 230 are shown as separate systems connected via communication links 221, some or all components may be integrated into a single system without departing from the spirit and scope of the present invention.

Handling system 230 in one embodiment includes head chuck assembly 240, chuck shaft 242, arms 250, pivot 260, and main handler 270. Main handler 270 may include various electrical, hydraulic, vacuum and/or other controls necessary to control the movement of arms 250, pivot 260, chuck shaft 242, and head chuck assembly 240. The elements of automated handler 230 cooperate to move head chuck assembly 240 into a first position, to engage imaging device 100 for testing. Imaging device 100 may be engaged to head chuck assembly 240 using vacuum, tension, friction, or other suitable means, mechanical or otherwise. Once automated handler 230 engages a device such as imaging device 100, automated handler 230 moves imaging device 100 into a position over tester 210 such that electrical leads 102 of imaging device 100 are aligned with contactors 112 of load board 110. Load board 110 is part of tester 210, and can be changed to facilitate testing of various types of devices with various packaging and/or If functional parameters such as size, number of pins, and the like.

In at least one embodiment, imaging device 100 is a conventional integrated circuit package capable of receiving both optical and electrical signals, and is known to those skilled in the art of integrated circuit manufacturing. Once automated handler 230 positions imaging device 100 such that electrical leads 102 are aligned with contactors 112, automated handler 230 extends chuck shaft 242 to place electrical leads 102 into electrical contact with contactors 112 on load board 110. The various movement of arms 250, pivot 260, chuck shaft 242, and head chuck assembly 240 may be controlled by controller 220. Controller 220 may control the movement of the various elements of automated test handler 230 directly or through commands issued to main handler 270, which in turn generates control signals. In addition, controller 220 may be used to control the electrical testing performed by tester 210, and the illumination of optical sensor 104, which may be an individual sensor or an array of sensors, by head chuck assembly 240, as further explained below.

Controller 220, in one embodiment, includes an information handling system having at least a processor and memory for storing a program of instructions to be executed by the processor. The program of instructions may be configured according to the teachings set forth herein to control tester 210 and automated handler 230 to perform appropriate functions. The operation of information handling systems in general, including various interfaces for communications between subsystems or network elements, is well known to those skilled in the art. Any of various information handling systems, including for example dedicated processor systems, mobile devices, desktop computers, workstations and the like, can be used to implement controller 220. A chosen information handling system may be located within a separate controller, as illustrated in FIG. 2, within tester 210, or within main handler 270. Alternatively, controller 220 may be, for example, an information handling system located at another physical location and connected to tester 210 and/or main handler 270 via a communications network such as an intranet or the Internet. In at least one embodiment of the present invention, tester 210 and automated handler 230 each contain a controller, such as controller 220, and these controllers communicate with each other via a communications interface which may be a parallel, serial, wireless or other suitable interface.

Figure 3:
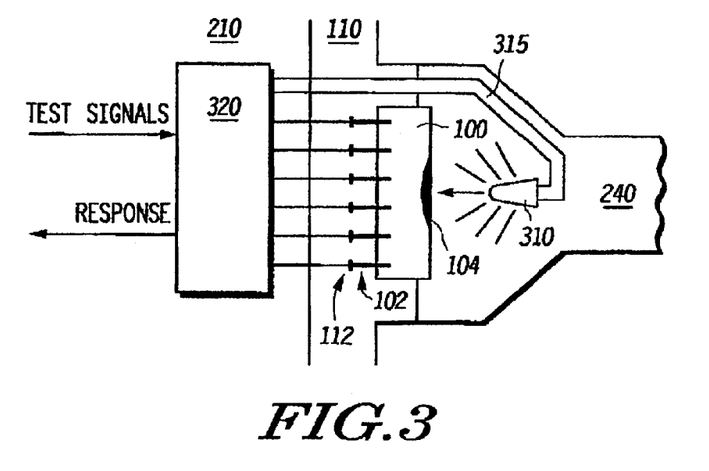
FIG. 3 is a diagram illustrating how a device including both optical and electrical portions can be fully tested using a single position according to at least one embodiment of the present invention.

Referring now to FIG. 3, a method of testing both the electrical and optical portions of an imaging device such as imaging device 100 will be discussed according to an embodiment of the present invention. In FIG. 3, head chuck assembly 240 is shown having placed imaging device 100 in electrical contact with tester 210 through load board 110. Note that contactors 112 and electrical leads 102 are in electrical contact such that test signals can be routed into imaging device 100 through interface 320, and responses generated by imaging device 100 can be delivered through interface 320 to either other portions of tester 210, controller 220 (FIG. 2), and/or main handler 270 (FIG. 2). Also illustrated in FIG. 3 is optical source 310, which is carried by an automated handler within head chuck assembly 240. In the illustrated embodiment power and/or control signals are provided through interface 320 via pogo pins 315. When appropriate power and/or control signals are received from interface 320 optical source 310 illuminates optical sensors 104 of imaging device 100.

In one embodiment, optical source 310 is a group of light emitting diodes (LEDs) which are chosen for their light output characteristics. In many cases optical sensors 104 of imaging device 100 are designed to respond to various colors or frequencies of light, and in many cases a white light source will be the most desirable for testing optical sensors 104. In such a case, optical source 310 is chosen to provide a light spectrum as close to white light as possible. In other cases however, optical sensors 104 may be designed to operate using other frequencies of electromagnetic radiation. In this case, an optical source 310 emitting the appropriate frequency of electromagnetic radiation, for example infrared light, can be chosen so that image sensors 104 can be optically tested. In other embodiments rather than choosing multiple light emitting diodes, each of which emits essentially white light, various diodes such as a red, green, or blue diodes can be used alone or in combination to produce the desired quality of light.

As will be discussed later, optical source 310 may also include various filters, filter packs and the like. In other embodiments a light source carried in tester 210 or elsewhere can be optically coupled through a fiber optic or similar connection so that an appropriate frequency of light is provided to illuminate optical sensors 104.

Figure 4:
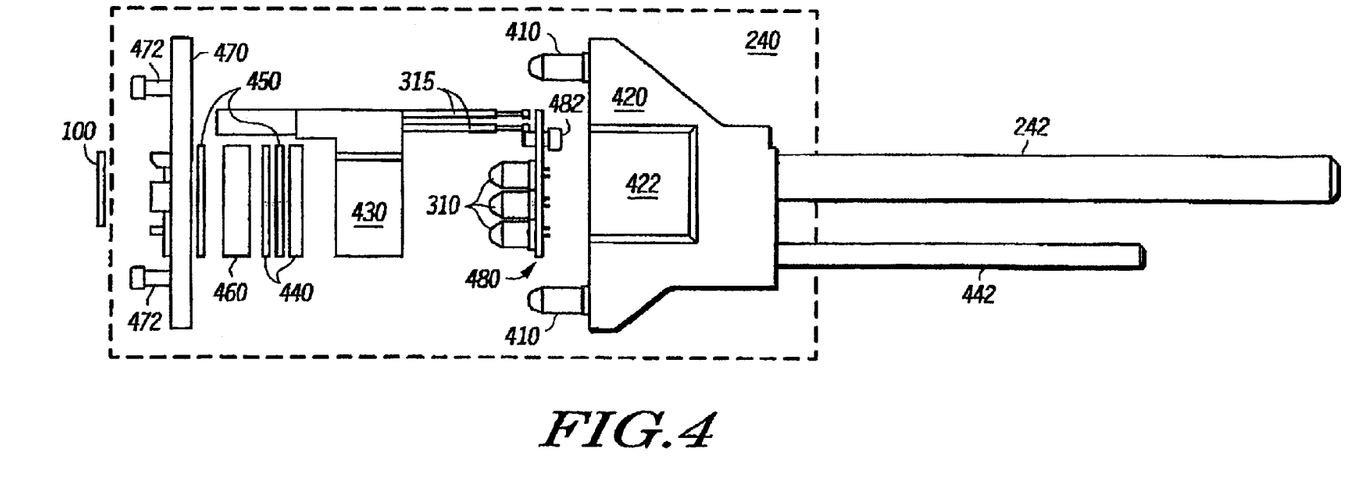
FIG. 4 is a diagram illustrating how an optical source can be positioned within a head chuck portion of an automated handling system according to an embodiment of the present invention.

Referring next to FIG. 4, the components of head chuck assembly 240 will be discussed in greater detail according to one embodiment of the present invention. Head chuck assembly 240 is connected to the remainder of automated handler 230 (FIG. 1) via chuck shaft 242. Chuck shaft 242 is used to provide extension and retraction of head chuck assembly 240 for proper positioning of a device to be tested, such as imaging device 100. Anti-rotation shaft 442 is also connected to head chuck assembly 240 to prevent undesired rotation of head chuck assembly 240. Head chuck assembly 240 includes chuck body 420, which houses necessary optical source components and mates with nest 470 using pins 410 and corresponding holes in nest 470. Nest 470 is secured to chuck body 420 using fasteners 472 which mate with corresponding holes (not shown) in chuck body 420. In one embodiment, protrusion 422 (see also FIG. 5 for clearer view) is formed on chuck body 420 in order to provide adequate room to house optical source components within chuck body 420.

In at least one embodiment, the components of an optical source housed within chuck body 420 include printed circuit board 480, which supports seven light emitting diodes 310 and provides traces for electrical connection of LEDs 310 through pogo pins 315. Fastener 482 secures printed circuit board 480 to LED housing 430. LED housing 430 holds filters 440, O-ring 450 that separates filters 440, opal filter 460 and an additional O-ring 450, which provides a vacuum seal between nest 470 and opal filter 460.

It will be appreciated that if alternative illumination sources are employed in place of LEDs 310, various structural changes affecting the size and placement of various components may be made without departing from the spirit and scope of the present invention. For example if prisms or fiber optics are used to route light through head chuck assembly 240, additional or fewer filters may be required. Also, protrusion 422 may be adjusted to allow greater or less room within head chuck assembly 240 to accommodated different component sizes. In addition, an illumination source may be carried on the outside of head chuck assembly 240 on some other portion of automated handler 230, or on some portion of tester 210 (FIG. 1). Light from that source can then be routed through various filters maintained either inside or outside head chuck assembly 240, and used to illuminate optical sensors on a device to be tested. Elements of the illustrated embodiment of the illumination source will be discussed in greater detail in relation to subsequent FIGS.

Figure 5:
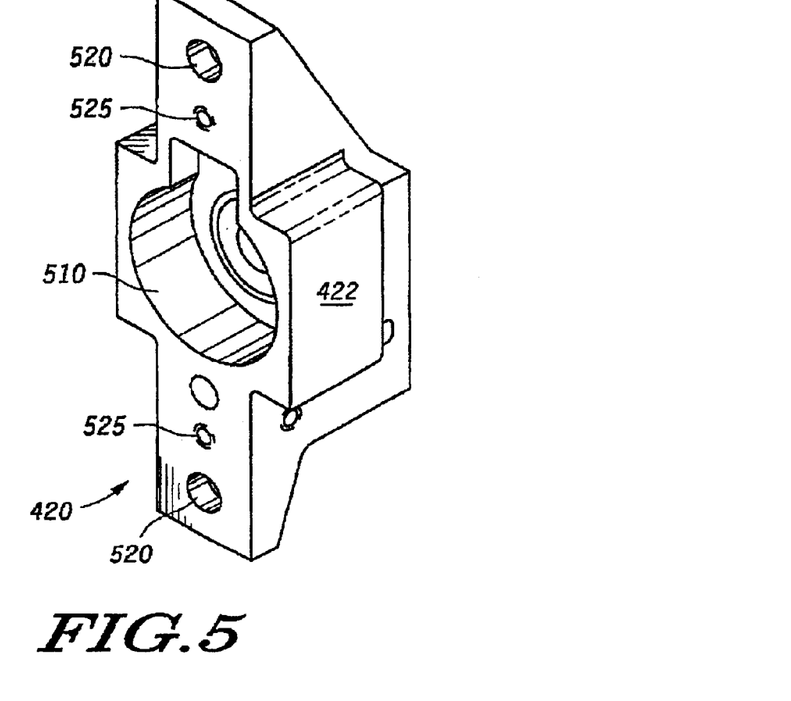
FIG. 5 illustrates a head chuck housing according to one embodiment of the present invention.

Referring now to FIG. 5 chuck body 420 will be discussed in greater detail according to an embodiment of the present invention. Chuck body 420, as noted earlier, includes protrusion 422 which allows for adequate space to be hollowed out from chuck body 420 so that LED housing 430 (FIG. 4) can be slideably engaged into opening 510. Openings 520 are provided in chuck body 420 to accommodated guide pins 410 (FIG. 4) which facilitate proper alignment with nest 470 (FIG. 4). Threaded openings 525 are also provided to mate with fasteners 472 (FIG. 4) and secure head chuck 420 to nest 470. The components of the optical source, which include in at least one embodiment LEDs 310 and various filters (FIG. 4), are positioned within opening 510. Other openings within head chuck 420 are provided for other fastening hardware and pneumatic fittings. It will be appreciated that the exact physical dimensions of chuck body 420 may be varied as necessary to accommodate preferred components of the optical source.

Figure 6:
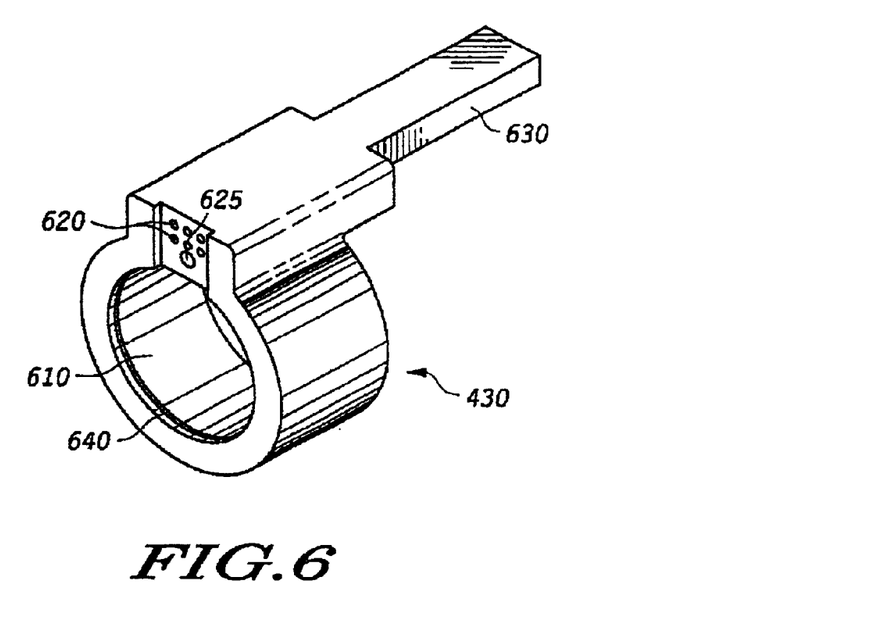
FIG. 6 illustrates an optical source assembly housing according to one embodiment of the present invention.

Referring now to FIG. 6, LED housing 430 will be discussed in greater detail according to one embodiment of the present invention. The rounded end of LED housing 430 includes a recessed groove 640 into which printed circuit board 480 sits. Within recessed groove 640 are six openings 620 to provide access to pogo pins 315. In addition, threaded opening 625 is provided to engage fastener 482 (FIG. 4) to secure circuit board 480 to LED housing 430. In the illustrated embodiment, six pogo pins are used, however fewer or more pogo pins may be used depending on the number of electrical connections required by printed circuit board 480 (FIG. 4) on which LEDs 310 are mounted.

Opening 610 is formed through LED housing 430 to provide room for placement of LEDs 310. On the end of LED housing 430 to which post 630 is connected, opening 610 is shaped to provide engagement with filters 440 (FIG. 4) and opal filter 460. The exact shape of opening 610 can be altered as desired to accommodate various shaped filters, filter packs, or other desired components. Post 630 is provided in part as a guide pin which passes through an opening in nest 470, as will be clear upon consideration of FIG. 9, and to provide guided engagement of head chuck assembly 240 onto tester 210 (FIG. 1). As with other components of the optical system, the exact dimensions of LED housing 430 can be altered to accommodate various sized and shapes of components as desired.

Figure 7:
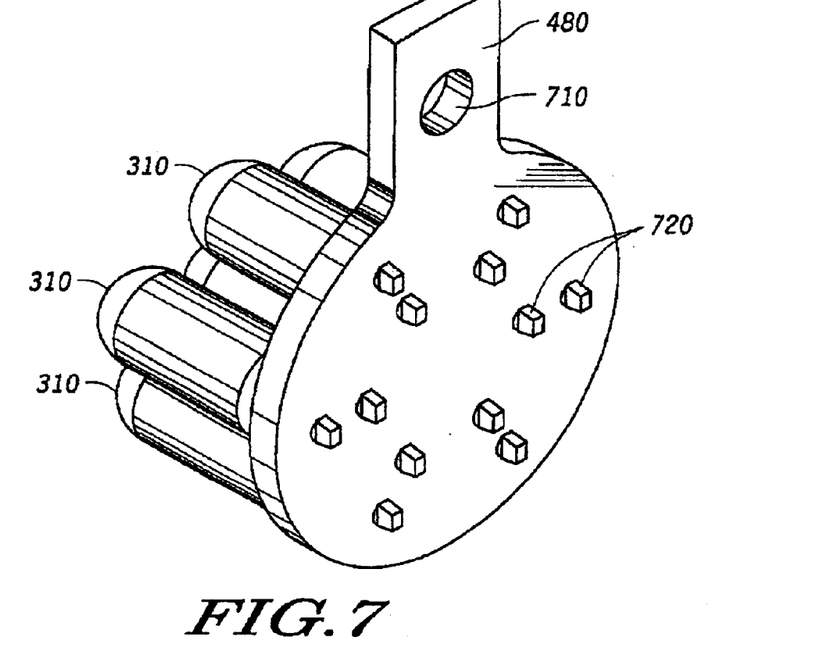
FIG. 7 illustrates a diode assembly according to one embodiment of the present invention.

Referring now to FIG. 7 printed circuit board 480 and LEDs 310 will be discussed according to an embodiment of the present invention. In at least one embodiment of the present invention, seven LEDs 310 are mounted on printed circuit board 480 which is secured to LED housing 430 by a fastener positioned through opening 710 and into threaded opening 625 (FIG. 6). LEDs 310 may be mounted to printed circuit board 480 by soldering the electrical leads 720 to printed circuit board 480, or through other various means known to those skilled in the art of printed circuit board manufacturing. As noted earlier, various types of electromagnetic radiation/light sources can be used without departing from the spirit and scope of the present invention. In at least one embodiment, the seven LEDs 310 are chosen from a group of LEDs that have been characterized to produce essentially white light. More or fewer LEDs 310 may be used depending on the intensity of light desired for use in testing optical sensors of an imaging device. For example, if an optical sensor on a device being tested is designed to respond to infrared or ultraviolet light, then infrared or ultraviolet light emitting diodes or other light sources can be used instead of diodes which produce white light. Alternatively different combinations of diodes may be used to produce a desired quality of light. For example red, green and blue LEDs may be combined to produce white light which can then be filtered to produce the desired quality of light. Additionally, light sources other than LEDs 310 may be used if so desired. For example, incandescent bulbs having various coatings, films or filament compositions can be used if desired to produce the necessary quality of light to test optical sensors of an imaging device such as imaging device 100 (FIG. 1).

It will be appreciated that if a light source is maintained elsewhere and electromagnetic radiation from the light source is routed through LED housing 430, printed circuit board 480 and pogo pins 315 may not be needed. Various prisms, optical waveguides and/or other electromagnetic radiation sources may be employed in place of LEDs 310 consistent with the teaching set forth herein.

Figure 8:
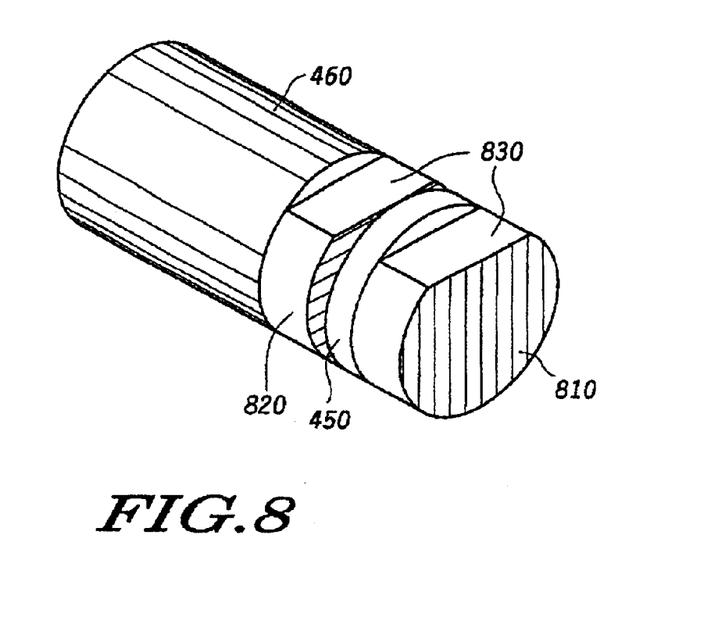
FIG. 8 illustrates a filtering assembly according to one embodiment of the present invention.

Referring next to FIG. 8, a filter arrangement will be discussed according to one embodiment of the present invention. In at least one embodiment filters 810 and 820 are lenticular lenses that have grooves 815 placed at 90 degree angles to each other in order to filter electromagnetic radiation produced by LEDs 310 (FIG. 7) in a desired manner. Filters 810 and 820 are separated by O-ring 450. Filters 810 and 820 have flats formed on one side to facilitate proper positioning within LED housing 430. In addition to filters 810 and 820, in at least one embodiment an opal filter 460 having an opal coating 462 is used. Opal filter 460 and filters 810 and 820 fit within LED housing 430. An additional O-ring (not illustrated) is used to provide a seal between opal filter 460 and nest 470 when nest 470 is engaged with chuck housing 420 (FIG. 4). It will be appreciated that various filters can be chosen and combined either separately or as filter packs comprising a combination of selected filters, by those skilled in the art in order to properly filter electromagnetic radiation produced by LEDs 310 so that accurate testing of optical inputs on a device under test can be performed. The choice of specific filters may be dependent upon at least the type of optical sensors being tested and the characteristics of the electromagnetic radiation source, and various combinations of filters may be used according to the teachings set forth herein.

Figure 9:
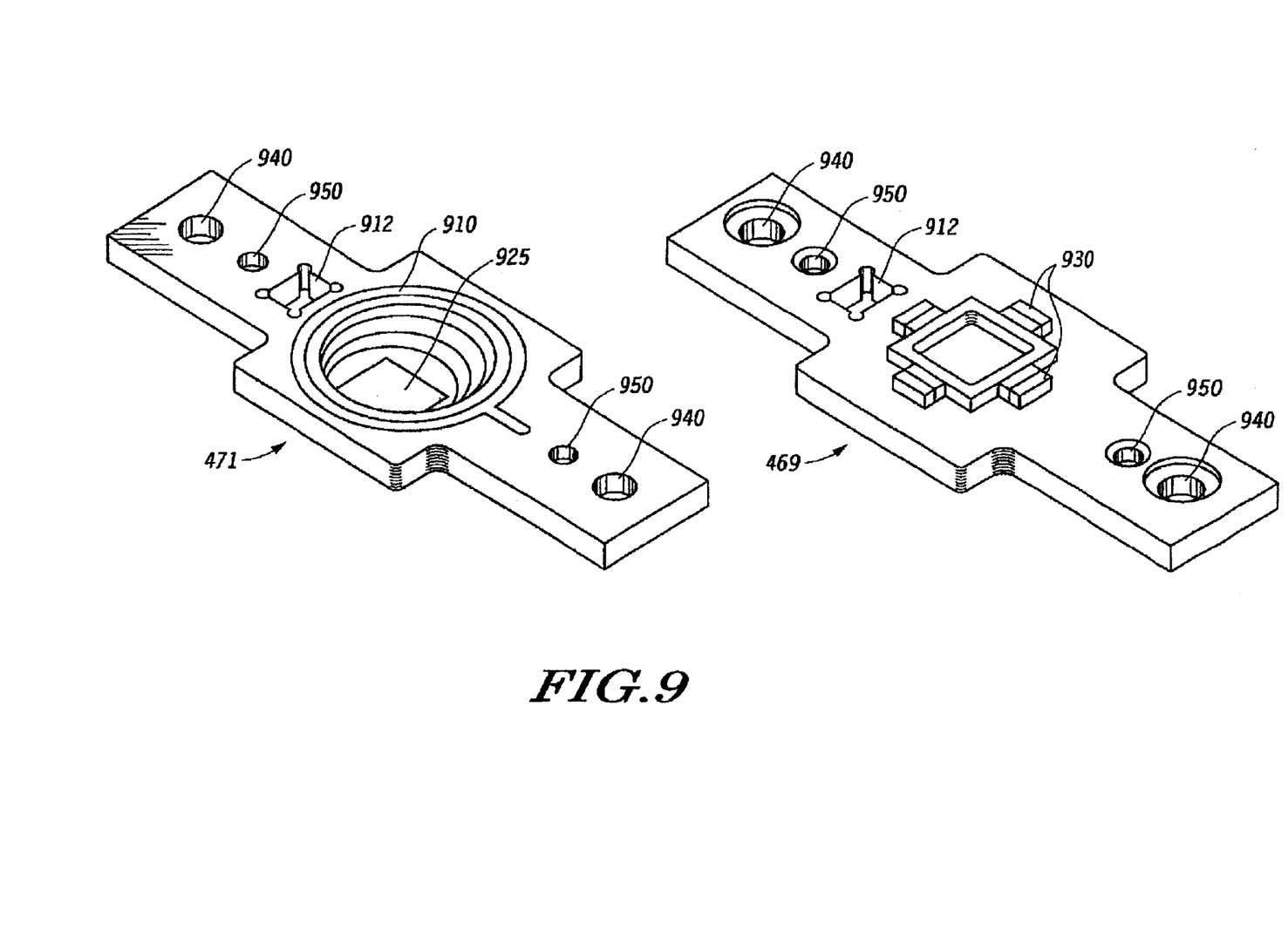
FIG. 9 is a diagram illustrating the front and back of a nest according to one embodiment of the present invention.

Referring now to FIG. 9, nest 470 will be discussed in greater detail. View 471 shows the side of nest 470 that mates with chuck assembly 420, and view 469 shows the side of nest 470 used to engage an integrated circuit package or other device to be tested. Considering view 471 first note O-ring seat 910 which is used to engage an O-ring to provide a vacuum seal between opal filter 460 and opening 925. The other openings in nest 470 include post opening 912 through which post 630 of LED housing 430 (FIG. 6) slides, and openings 940 through which guide pins 410 (FIG. 4) pass to provide the proper engagement of chuck hosing 420 to nest 470. Additionally, openings 950 are provided to facilitate placement of fasteners 472 (FIG. 4) used to secure nest 470 to chuck housing 420. In view 469 retainers 930 are provided to grasp, hold, guide, or otherwise facilitate engagement of an integrated circuit package or other device to be tested. It should be noted that the dimension of retainers 930 can be varied depending upon the dimension of the device to be tested.

Figure 10:
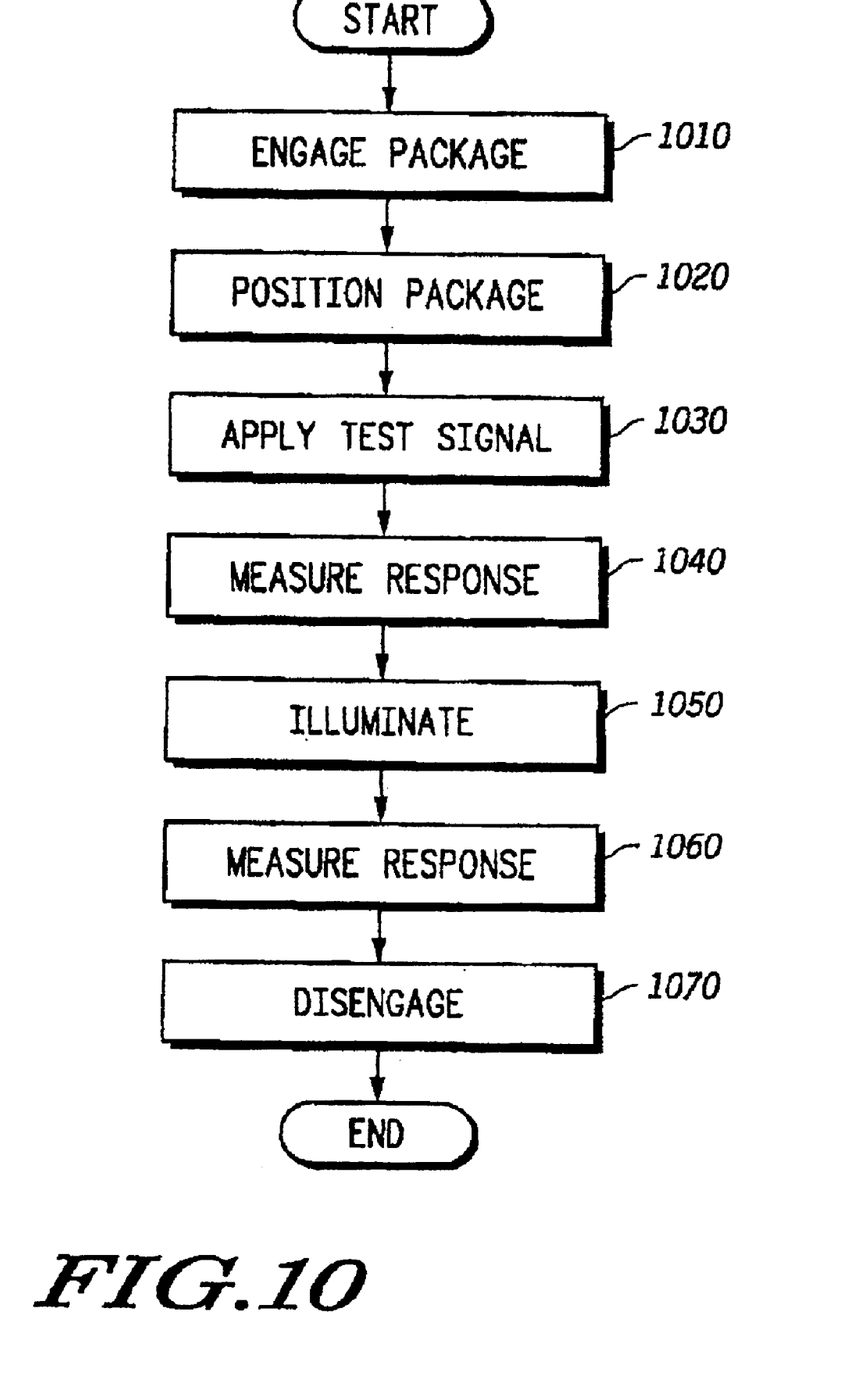
FIG. 10 is a flowchart illustrating a method according to an embodiment of the present invention.

Referring next to FIG. 10, a method according to an embodiment of the present invention will be discussed. The method begins in step 1010, where an automated handling system, for example an automated integrated circuit (IC) tester engages a package, such as an imaging device, to be tested. As discussed with reference to previous figures, the package may be engaged by a head chuck carrying a light source for use in illuminating an optical sensor portion of the imaging device.

The method proceeds to step 1020, where the package is positioned for testing of both electrical and optical portions. In at least one embodiment, the package is positioned in a "live bug" orientation so that purely electrical portions of the package can be tested in a manner consistent with conventional testers. In order to test the electrical portion of the package, test signals are applied to electrical pins of the package in step 1030, and responses to the test signals are measured using the electrical pins in step 1040.

After the electrical tests are performed, or in at least one embodiment at the same time as the electrical tests are being performed, an illumination source illuminates the optical portion of the package in step 1050. As noted earlier, in at least one embodiment the illumination of the optical portion is performed using an illumination source carried by the automated handling system. The response to the illumination of the optical portion of the package may be determined by evaluating electrical responses measured at the electrical pins of the package.

Finally, after both the electrical and optical portions of the package have been tested, the automated handler moves the package out of the test position and disengages from the package. Note that the optical tests are performed with the package in the same position as that used for the electrical tests, and the tests may be performed in various sequences. For example, the electrical tests may be performed first, followed by the optical tests; the optical tests may be performed first followed by the electrical tests; or the both test may be performed simultaneously. In at least one embodiment, there is no need for the automated handler to reposition the package or otherwise disengage from the package under test until both the optical and electrical portions of the package have been tested.

In summary, it should be apparent in view of the foregoing disclosure that providing for an illumination source to be carried on an automated handler or otherwise providing for both optical and electrical portions of an image device to be tested using only a single position can reduce the time needed to perform full parametric and functional testing of a device which includes both optical and electrical inputs. Considering the large number of devices which must be tested in most modern manufacturing plants, this time savings could result in substantial cost savings. In addition to these cost savings, fewer handling steps can reduce the possibility of damaging a product during handling operations.

In the preceding detailed description of the figures, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical, and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A method comprising the steps of:
engaging an integrated circuit to be tested with an automated handler, the integrated circuit including an electrical input and an optical input;
positioning the integrated circuit to be tested in a live bug orientation using the automated handler;
applying a test signal to the electrical input;
measuring a response to the test signal;
illuminating the optical input while the integrated circuit remains in the live bug orientation; and
measuring a response to the illumination of the optical input while the integrated circuit remains in the live bug orientation.

2. The method as in claim 1, wherein the step of positioning the integrated circuit includes electrically coupling the package to an automated tester.

3. The method as in claim 1, wherein the step of illuminating the optical input includes illuminating the optical input using an optical source carried by the automated handler.

4. The method as in claim 3, wherein the optical source is carried within a head chuck portion of the automated handler.

5. The method as in claim 1, wherein the step of illuminating the optical input includes:
generating electromagnetic radiation using a light emitting diode; and
filtering the electromagnetic radiation.

6. The method as in claim 5, wherein filtering the electromagnetic radiation includes passing the electromagnetic radiation through a filter pack.

7. The method as in claim 6, wherein the filter pack includes a plurality of lenticular array filters.

8. The method as in claim 5, wherein filtering the electromagnetic radiation includes passing the electromagnetic radiation through an opal filter.

9. An automated handler comprising an optical source to illuminate a sensor of an imaging device when the imaging device is electrically coupled to an integrated circuit tester in a live-bug configuration.

10. The automated handler as in claim 9, wherein said optical source includes:

at least one light emitting diode; and an optical filter.

11. The automated handler as in claim 10, wherein said at least one light emitting diode is capable of emitting substantially white light.

12. The automated handler as in claim 11, wherein said at least one light emitting diode includes one or more diodes selected from the group consisting of red diodes, green diodes, blue diodes, infrared diodes, and ultraviolet diodes.

13. The automated handler as in claim 10, wherein said optical filter includes a filter pack.

14. The automated handler as in claim 13, wherein said filter pack includes a plurality of lenticular array filters.

15. The automated handler as in claim 10, wherein said optical filter includes an opal filter.

16. The automated handler as in claim 9, wherein said optical source is carried within a head chuck portion of said automated handler.

17. A computer readable medium tangibly embodying a program of instructions, said program of instructions to be stored in a memory and executed by a processor, said program of instructions comprising:

instructions to engage an integrated circuit to be tested with an automated handler, the integrated circuit including an electrical input and an optical input;

instructions to position the integrated circuit in a live bug orientation;

instructions to apply a test signal to the electrical input;

instructions to obtain a response to the test signal;

instructions to illuminate the optical input while the integrated circuit remains in the live bug orientation;

instructions to obtain a response to the illumination of the optical input while the integrated circuit remains in the live bug orientation.

18. The computer readable medium as in claim 17, wherein said instructions to illuminate the optical input include instructions to activate an optical source carried by the automated handler.

19. The computer readable medium as in claim 18, wherein the optical source is carried within a head chuck portion of the automated handler.

20. A method comprising:

positioning an integrated circuit using a handler, the integrated circuit including an electrical portion and an optical portion;

testing the electrical portion of the integrated circuit; and testing the optical portion of the integrated circuit using an optical source carried by the handler.

21. The method as in claim 20, wherein positioning the device includes electrically coupling the integrated circuit to an automated tester.

22. The method as in claim 20, wherein testing the optical portion includes illuminating an optical input of the integrated circuit using the optical source carried by the handler.

23. The method as in claim 20, wherein using the optical source includes:

generating electromagnetic radiation using a light emitting diode; and filtering the electromagnetic radiation.

24. The method as in claim 23, wherein filtering the electromagnetic radiation includes passing the electromagnetic radiation through a filter pack.

25. The method as in claim 24, wherein the filter pack includes a plurality of lenticular array filters.

26. The method as in claim 23, wherein filtering the electromagnetic radiation includes passing the electromagnetic radiation through an opal filter.

27. The method as in claim 20, wherein the optical source is carried within a head chuck portion of the handler.

* * * * *